(12) United States Patent
Chang et al.

(10) Patent No.: US 6,630,709 B2
(45) Date of Patent: Oct. 7, 2003

(54) MULTI-LEVEL FLASH EEPROM CELL AND METHOD OF MANUFACTURE THEREOF

(75) Inventors: Sang-Hoan Chang, Ichon (KR); Ki-Seog Kim, Ichon (KR); Keun-Woo Lee, Ichon (KR); Sung-Kee Park, Ichon (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/739,401

(22) Filed: Dec. 19, 2000

(65) Prior Publication Data

US 2001/0026480 A1 Oct. 4, 2001

(30) Foreign Application Priority Data

Dec. 22, 1999 (KR) .............................................. 99-60508

(51) Int. Cl.[7] .............................................. H01L 29/76
(52) U.S. Cl. ...................................... 257/319; 257/321
(58) Field of Search ................................. 438/257–267; 257/319–320, 321

(56) References Cited

U.S. PATENT DOCUMENTS

| | | | |
|---|---|---|---|
| 4,380,863 A | * | 4/1983 | Rao |
| 4,462,090 A | | 7/1984 | Izuka |
| 4,577,215 A | * | 3/1986 | Stewart et al. |
| 4,853,895 A | * | 8/1989 | Mitchell et al. |
| 5,053,841 A | | 10/1991 | Miyakawa et al. |
| 5,523,972 A | | 6/1996 | Rashid et al. |
| 5,633,520 A | * | 5/1997 | Wu et al. ................... 257/315 |
| 5,666,307 A | | 9/1997 | Chang |
| 5,674,768 A | * | 10/1997 | Chang et al. |
| 5,679,970 A | * | 10/1997 | Hartmann ................... 257/320 |
| 5,736,443 A | * | 4/1998 | Park et al. ................... 438/257 |
| 5,950,088 A | * | 9/1999 | Park ............................ 438/266 |
| 5,991,204 A | | 11/1999 | Chang |
| 6,034,892 A | | 3/2000 | Choi |
| 6,040,993 A | | 3/2000 | Chen et al. |
| 6,091,642 A | | 7/2000 | Pasotti et al. |
| 6,097,628 A | | 8/2000 | Rolandi |
| 6,115,285 A | | 9/2000 | Montanari et al. |
| 6,168,995 B1 | * | 1/2001 | Kelley et al. ................ 438/266 |

FOREIGN PATENT DOCUMENTS

| | | |
|---|---|---|
| EP | 0138439 | 4/1985 |
| JP | 11-273374 | 10/1999 |
| WO | 94/01892 | 1/1994 |

OTHER PUBLICATIONS

EPO Search Report, dated Nov. 1, 2001, regarding Application No. GB 0031118.3.

* cited by examiner

*Primary Examiner*—Richard Booth
(74) *Attorney, Agent, or Firm*—Finnegan, Henderson, Farabow, Garrett & Dunner, L.L.P.

(57) ABSTRACT

A multi-level EEPROM cell and a method of manufacture thereof are provided so as to improve a program characteristic of the multi-level cell. For the purpose, the multi-level flash EEPROM cell includes a floating gate formed as being electrically separated from a silicon substrate by an underlying tunnel oxide layer, a first dielectric layer formed over the top of the floating gate, a first control gate formed on the floating gate as being electrically separated from the floating gate by the first dielectric layer, a second dielectric layer formed on the sidewall and top of the first control gate, a second control gate formed on the sidewall and top of the first control gate as being electrically separated from the first control gate by the second dielectric layer, and a source and drain formed in the substrate as being self-aligned with both edges of the second control gate.

3 Claims, 2 Drawing Sheets

MULTI-LEVEL FLASH EEPROM CELL AND METHOD OF MANUFACTURE THEREOF

FIELD OF THE INVENTION

The present invention relates to a multi-level flash EEPROM cell and a method of manufacture thereof; particularly to a multi-level EEPROM cell and a method of manufacture thereof capable of improving a program characteristic of the multi-level cell by employing a first and a second control gates whose parts are overlapped to each other and which overlie the top of a floating gate.

DESCRIPTION OF THE PRIOR ART

A flash EEPROM is getting popular since it has a lot of unique advantages. An obstacle preventing the flash EEPROM from being popular is that a high cost is required for a unit of information. In order to overcome the above drawback, manufacturing companies focus on increasing the integration of a cell. Since, however, a structure of the flash EEPROM is much complicated compared with that of a DRAM, there is a difficulty in the cell integration.

In a Strata Flash introduced by Intel corporation, which employs multi-level cells therein, a multi-level cell is programmed to a desired level through a process slowly implanting a small amount of electrons, e.g., about 3000 numbers of electrons, into the cell. Therefore, it takes a long time until the cell is programmed to the highest level.

SUMMARY OF THE INVENTION

It is, therefore, an object of the present invention to provide a multi-level EEPROM cell and a method of manufacture thereof capable of improving a program characteristic of the multi-level cell through the use of a first and a second control gates that are partially overlapped with each other and overlies the top of a floating gate.

In accordance with one aspect of the present invention, there is provided a multi-level flash EEPROM cell comprising: a floating gate formed as being electrically separated from a silicon substrate by an underlying tunnel oxide layer; a first dielectric layer formed over the top of the floating gate; a first control gate formed on the floating gate as being electrically separated from the floating gate by the first dielectric layer; a second dielectric layer formed on the sidewall and top of the first control gate; a second control gate formed on the sidewall and top of the first control gate as being electrically separated from the first control gate by the second dielectric layer; and a source and drain formed in the substrate as being self-aligned with both edges of the second control gate.

In accordance with another aspect of the present invention, there is provided a method for manufacturing a flash EEPROM cell comprising the steps of: patterning a first polysilicon layer after forming a tunnel oxide layer on a silicon substrate; forming a first dielectric layer on the top of the first polysilicon layer; making a part of a first control gate by depositing a second polysilicon layer on the top of the first dielectric layer; depositing a second dielectric layer on a sidewall of the first control gate; forming a second control gate by depositing a third polysilicon layer on the top of the second dielectric layer; and forming a source and a drain by using a source/drain ion implantation process which is fulfilled with a self-aligned etching technique.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the drawings, some of the preferred embodiments of the present invention will be explained in detail.

Figure 1:
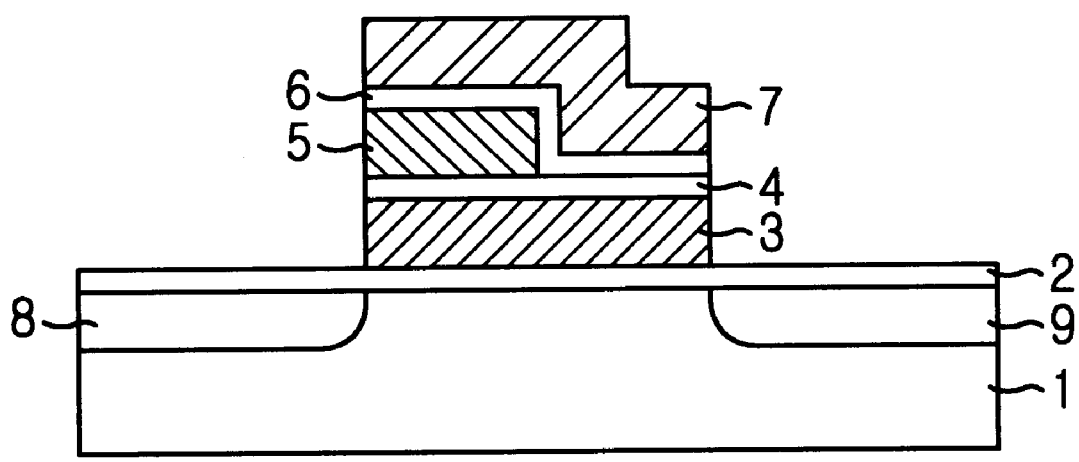
FIG. 1 illustrates a cross sectional view of a multilevel flash EEPROM cell in accordance with the present invention.

In FIG. 1, there is illustrated a cross sectional view of showing a structure of a multi-level flash EEPROM cell in accordance with the present invention.

A floating gate 3 is electrically separated with a silicon substrate 1 by an underlying tunnel oxide layer 2. A first dielectric layer 4 overlies the top of the floating gate 3. A first control gate 5 is electrically separated with the floating gate 3 by the first dielectric layer 4. A second dielectric layer 6 is formed on the top and sidewall of the first control gate 5. A second control gate 7 is electrically separated with the first control gate 5 by the second dielectric layer 6 and formed over a sidewall and top of the second dielectric layer 6. A source 8 and a drain 9 are formed in the substrate 1 as being self-aligned with both edges of the second control gate 7.

Moreover, the floating gate 3 is formed electrically separated with the substrate 1 by the underlying tunnel oxide layer 2. The first and second control gates 5 and 7 are made horizontally adjacent to each other and electrically separated with the floating gate 3 by the first dielectric layer 4 which lies over the floating gate 3. The control gates 5 and 7 are further electrically separated to each other by the second dielectric layer 6 deposited therebetween. As described above, the source 8 and the drain 9 are formed through the use of a self-aligned etching technique along both edges of the second control gate 7.

At this time, the floating gate 3 can be programmed through a thermion implantation process that is performed by a voltage difference between the source 8 and the drain 9. On the other hand, the floating gate 3 can be erased by the F-N tunneling that is fulfilled by a voltage difference between the first and second control gates 5 and 7 and the drain 9.

In the flash EEPROM cell in which electrons are implanted into the floating gate 3 in a multi-level manner, the control gates 5 and 7 are separated by the underlying floating gate 3 and the dielectric layer 4 and they are partially overlapped with the floating gate 3 to thereby adjust their coupling. As a result, the electrons can be directly implanted into or emitted from each level of the cell having the multi levels instead of moving from a lower level to a higher level.

Figure 2A:
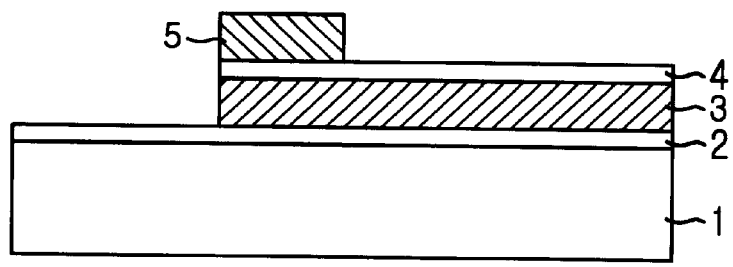
FIGS. 2A, 2B, and 2C show cross sectional views of describing a method of manufacturing the multi-level flash EEPROM cell in accordance with the present invention.
Figure 2B:
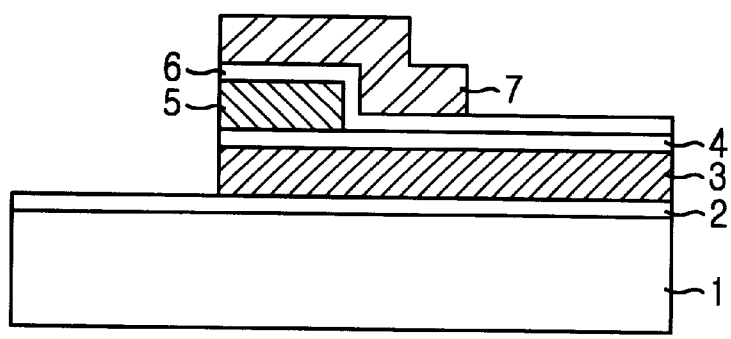
Figure 2C:
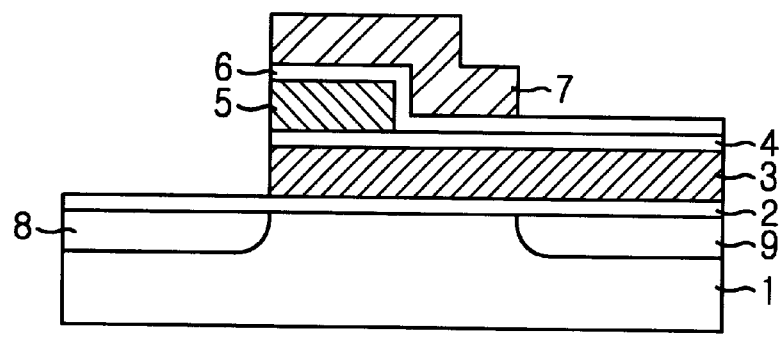

Referring to FIGS. 2A to 2C, there are shown cross sectional views of describing a method of manufacturing the multi-level flash EEPROM cell in accordance with the present invention.

As illustrated in FIG. 2A, the tunnel oxide layer 2 is formed over the silicon substrate 1. A first polysilicon layer 3 is deposited on the top of the tunnel oxide layer 2 and then etched by a width of the floating gate. The first dielectric layer 4 having an Oxide/silicon Nitride/silicon Oxide (ONO) structure is formed over the first polysilicon layer 3. A second polysilicon layer 5 is deposited on the top of the first dielectric layer 4 and then a part of the layer 5 is etched away to thereby form a first control gate.

In FIG. 2B, a second dielectric layer 6 is formed over the second polysilicon layer 5. A third polysilicon layer 7 is deposited on the top of the second dielectric layer 6 and then etched away through the use of a self-aligned etching technique so as to form a second control gate.

In FIG. 2C, the source 8 and the drain 9 are formed by a source/drain Ion Implantation (I/I) self-aligned with the gate electrode stack.

The program and erase operation of the inventive flash EEPROM cell is explained hereinbelow.

In the program operation, after making the substrate grounded, the cell is programmed through a channel thermion implantation process by providing different voltages into the first and the second control gates 5 and 7 according to each target voltage Vt and inputting 5V to the drain.

On the other hand, in the erase operation, the cell is erased through the use of the F-N tunneling by making the substrate floated, providing about −12V into the first and the second control gates 5 and 7, and inputting 5V to a bit line of a desired floating gate.

Further, a read-out operation of the EEPROM cell is described hereinafter.

A data stored in the cell is detected by sequentially providing respective voltages corresponding to various target voltages Vt to the first and the second control gate at the same time. For instance, if threshold voltages Vt have first, second, third and fourth voltage levels of 1, 3, 5 and 7V, respectively, the data is detected by sequentially providing 2, 4 and 6V into the cell.

As described above, in accordance with the present invention, by using the first and the second control gates partially overlapped with the underlying floating gate, the program characteristic of the multi-level cell is improved and the integration thereof is also increased as much as twice. Further, the programming time required for implanting electrons can be decreased so that the programming efficiency is enhanced.

While the present invention has been described with respect to the particular embodiments, it will be apparent to those skilled in the art that various changes and modifications may be made without departing from the spirit and scope of the invention as defined in the following claims.

What is claimed is:

1. A multi-level flash EEPROM cell, comprising:

a tunnel oxide layer over a silicon substrate;

a floating gate over the tunnel oxide layer and electrically isolated from the silicon substrate;

a first dielectric layer over the floating gate;

a first control gate at least partially over the first dielectric layer and electrically isolated from the floating gate;

a second dielectric layer over the first control gate and covering exposed horizontal portions of the first dielectric layer;

a second control gate over the second dielectric layer and electrically isolated from the first control gate; and a source and a drain in the semiconductor substrate each having a sidewall, wherein one edge of said first control gate is aligned with an edge of said floating gate and said source.

2. The multi-level flash EEPROM cell as recited in claim 1, wherein the first and second control gates each at least partially overlap the floating gate.

3. A multi-level flash EEPROM cell, comprising:

a tunnel oxide layer over a silicon substrate;

a floating gate over the tunnel oxide layer and electrically isolated from the silicon substrate;

a dielectric layer over the floating gate;

first and second control gates at least partially overlapping the dielectric layer and at least partially laterally positioned with respect to one another, said first and second control gates electrically isolated from the floating gate; and a source and a drain in the substrate, each having a sidewall aligned with a respective one of a pair of sidewalls of the second control gate;

wherein one edge of said first control gate is aligned with an edge of said floating gate and said source; and wherein the floating gate is programmable through a thermion implantation process using a voltage difference between the source and drain, and is erasable by a F-N tunneling process using a voltage difference between the first and second control gates and the drain.

* * * * *